(12) United States Patent
Noras

(10) Patent No.: US 7,970,453 B2
(45) Date of Patent: Jun. 28, 2011

(54) RECEPTION COIL MAINTAINING ELEMENT FOR AN MR-IMAGING SYSTEM

(76) Inventor: Hubert Noras, Wurzburg (DE)

( * ) Notice: Subject to any disclaimer, the term of this patent is extended or adjusted under 35 U.S.C. 154(b) by 680 days.

(21) Appl. No.: 11/919,545

(22) PCT Filed: Apr. 28, 2006

(86) PCT No.: PCT/DE2006/000753
§ 371 (c)(1),
(2), (4) Date: Oct. 30, 2007

(87) PCT Pub. No.: WO2006/116980
PCT Pub. Date: Nov. 9, 2006

(65) Prior Publication Data
US 2009/0203990 A1 Aug. 13, 2009

(30) Foreign Application Priority Data

May 5, 2005 (DE) .......................... 10 2005 021 621

(51) Int. Cl.
*A61B 5/05* (2006.01)
(52) U.S. Cl. .......................... 600/422; 600/410; 600/421
(58) Field of Classification Search .................. 600/407, 600/421, 422
See application file for complete search history.

(56) References Cited

U.S. PATENT DOCUMENTS

| 4,882,560 A | 11/1989 | Young et al. |
| 4,891,596 A | 1/1990 | Mitomi |
| 5,085,219 A * | 2/1992 | Ortendahl et al. ............ 600/422 |
| 6,650,926 B1 | 11/2003 | Chan et al. |

FOREIGN PATENT DOCUMENTS

| DE | 38 19 541 A1 | 12/1988 |
| DE | 10 2004 052 943 A1 | 6/2005 |
| EP | 0 318 257 | 5/1989 |
| JP | 03-272739 | 12/1991 |
| JP | 20011095776 | 4/2001 |

* cited by examiner

*Primary Examiner* — Long V Le
*Assistant Examiner* — Nicholas L Evoy
(74) *Attorney, Agent, or Firm* — Jones, Tullar & Cooper, PC

(57) ABSTRACT

A reception coil maintaining element for an MR-imaging system includes two phase-controlled multi-element arrays of an RF multi-channel surface reception coil. Both of these phase-controlled, multi-element arrays have a reception surface including a center having a longitudinal axis that crosses that center. Each of these multi-element arrays is arranged on an arm which can pivot about a common pivotable axis. A vertical first plane is parallel to this pivotable axis. A vertical left plane extends along the longitudinal axis of the center of the left reception surface of the left multi-element array. A vertical right plane extends along a longitudinal axis of the center of the right reception surface of the right multi-element array. Both of these vertical left and right planes have approximately the same spacing with respect to the vertical first plane of the pivotable axis where the reception coil maintaining element in accordance with the present invention is in its operational state.

14 Claims, 2 Drawing Sheets

RECEPTION COIL MAINTAINING ELEMENT FOR AN MR-IMAGING SYSTEM

CROSS-REFERENCE TO RELATED APPLICATION

This application is the U.S. national phase, under 35 USC 371, of PCT/DE2006/000753, filed Apr. 28, 2006; published as WO 2006/116980 A2 and A3 on Nov. 9, 2006, and claiming priority to DE 10 2005 021 621.8, filed May 5, 2005, the disclosures of which are expressly incorporation herein by reference.

FIELD OF THE INVENTION

The present invention is directed to a receiving coil support element for an MR imaging system. The support element is for phased multi-element coil arrays in an RF multi-channel surface receiving coil. Each array is enclosed within a housing and is intended to enable a parallel imaging process for an MR imaging system of an MR tomography.

BACKGROUND OF THE INVENTION

Support elements for MR surface receiving coils have become generally known in the art, for example from DE 38 19 541 A1.

It is generally known that receiving coils, which are configured as surface coils, have a much smaller geometry than receiving coils that are configured as whole body coils. Their disadvantage is their limited "field of view", or FOV. These surface coils are therefore particularly well suited to facilitating the making of medical diagnoses in certain small regions on the surface of, and in the interior of the body and/or its extremities. However, when the parallel imaging process is applied, using phased arrays that contain multiple coils configured to receive an MR signal, they generate high-resolution images, with high detection sensitivity at high imaging speed.

FIELD OF THE INVENTION

The object of the present invention is to provide a support element for at least two multi-element surface receiving coils. These two coils are spaced from one another, are phased, and operate using a parallel imaging process. The support element, in accordance with the present invention, enables an optimization of the parallel imaging process.

This object is attained with the provision of a receiving coil element for multi-element arrays in an RF multi-channel surface receiving coil. Each array is enclosed in a housing and is intended to enable a parallel imaging process for an MR imaging system of an MR tomography, with an operational main magnetic field direction that is determined by its main magnet. Each of the phased multi-element arrays has a receiving surface with a center through which a longitudinal axis passes. Each of the housings, and its phased, multi-element array is attached, via a joint, to an end of a support element.

The advantages of the present invention lie especially in that the multi-element surface receiving coils, which are arranged in two spatially separate, and preferably similar housings, which housings are spaced from one another, and which multi-element surface receiving coils operate using "parallel imaging process", can be adjusted individually, together, or synchronously in terms of their spatial position. The two housings can be supported directly or indirectly, for example, on a base plate. In an ideal orientation, the two multi-element surface receiving coils can be oriented in relation to one another, and can be moved toward one another such that the two receiving surfaces, or their field of view of the two multi-element surface receiving coils, are superimposed onto one another with their maximum shadow, as measured, for example, via radiation with polarized light. With the proper configuration, in accordance with the present invention, this positioning can also be maintained when both of the multi-element surface receiving coils are moved synchronously in the same direction in space.

When a distance between the two multi-element surface receiving coils is changed, the present invention provides that the two receiving surfaces, or the field of view of the two multi-element surface receiving coils are superimposed with, at least parts of their shadows. From this type of mutual "partially superimposed shadow" position, at least one and preferably both multi-element surface receiving coils can be moved, either individually or together in space, each via the manual or the motor-driven actuation of an adjustment device. In each case, the adjustment device is connected, for example in a positive or in an adhesive fashion, to the housings of the multi-element surface receiving coils. Each coil thus lies respectively in its mutual shadow that is the largest possible at a given time. Alternatively, the image signal, that is the largest possible at a given time, is generated.

The multi-element surface receiving coils can, in an advantageous configuration, be accommodated in plastic housings, which are fastened to individual support elements that may also be made of plastic. The combined support elements and the respective individual support elements, to which they may be fastened, can be structured in a wide variety of ways. For example, the various support elements can be straight or curved leaf springs or, for example, these support elements can be pliable, flexible arms that may be made of an MR-compatible material. Support elements, which are structured in this manner, make it possible to place the housings containing the multi-element surface receiving coils directly on the parts of the body which are to be examined. In other words, the support elements are supported indirectly on the base plate.

A rapid manual adjustment of the multi-element surface receiving coils or of their housings, such as, for example to reproduce a previous position, may be achieved, for example, by attaching scales to the joint with which the housings are each fastened to the one arm or to the individual support element or elements.

While using the combined receiving coil support element or the individual support elements, in accordance with the present invention and their arrangement on or in a patient support, the number of different surface coil configurations, which may be required for different examinations, can be significantly reduced. In this way, difficult parts of the body, such as parts of the head, of the shoulder, of the neck, of the prostate, and of the joints, can be examined using the receiving coil support elements in accordance with the present invention. In addition, the phased multiple receiving coil array can be placed very close to the body of the patient being examined, such as, for example without having to come in contact with the body of the patient who is undergoing the examination.

The housings with the multi-element surface receiving coils can also be easily exchanged. The combined receiving coil support element, together with the individual support elements can be configured such that they can permit only movements that are logical with respect to the actual main magnetic field direction of the gradient coil arrangement—horizontally or vertically oriented main magnetic field MH. In the preferred embodiment of the present invention, the receiving coil support elements are intended for a horizontally oriented main magnetic field direction MH of an MR tomograph.

BRIEF DESCRIPTION OF THE DRAWINGS

A preferred embodiment of the present invention is represented in the accompanying drawings, and will be described in greater detail in what follows.

The drawings show in.

DESCRIPTION OF THE PREFERRED EMBODIMENT

All the parts of the receiving coil support elements, the housing and the base plate, in accordance with the present invention, are made of an MR-compatible material.

Figure 1:
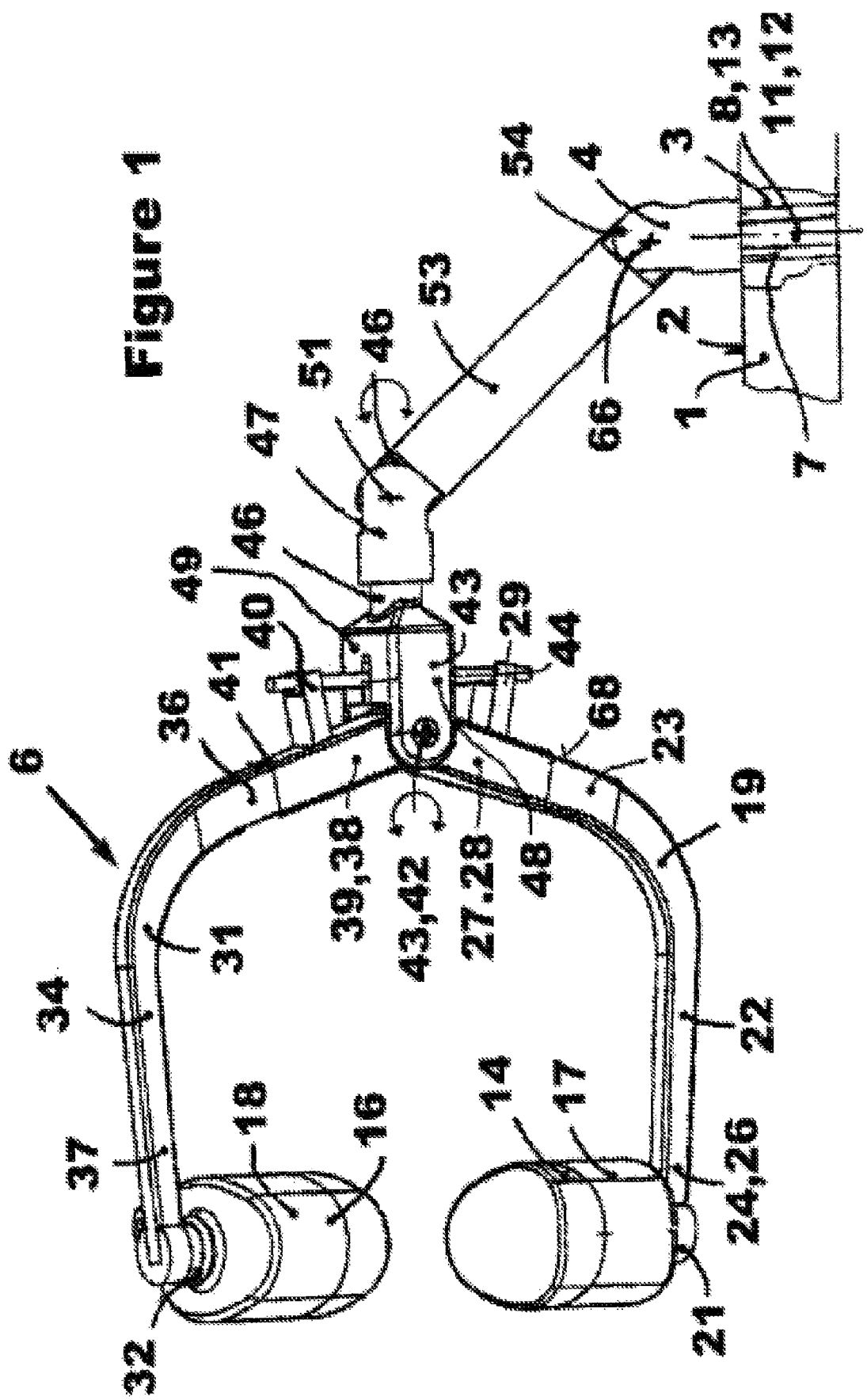
FIG. 1 a perspective view of a combined receiving coil support element with two individual support elements for an MR imaging system with two housings containing multi-element surface receiving coils, which are oriented in the main magnetic field direction MH of the main magnetic field device of an MR tomography in accordance with the present invention, wherein the combined receiving coil support element is rotated 90° around its horizontal longitudinal axis; and in FIG. 2 a perspective view of the combined receiving coil support element for an MR imaging system in accordance with FIG. 1, with a base plate that can be introduced into the interior of the MR tomograph, moving along the main magnetic field direction MH, and on which base plate the receiving coil support elements are mounted.

Referring initially to FIG. 1, distributed evenly over an upper surface 2 of a base plate 1, a plurality of mounting devices 3 for the foot 4 of a combined receiving coil support element 6 are provided. Each of these mounting devices 3 can be configured, for example, as a sliding key connection. To this end, a plurality of similar vertical bore holes 7, each with a vertical spring groove 8, are provided in the base plate 1, as may be seen in FIG. 2.

Each foot 4 has a cylindrical pin 12, for example on its lower section 11, the diameter of which cylindrical pin 12 is adapted to fit the bore hole 7 to form a sliding fit in cooperation with that bore hole 7. The cylindrical pin 12 is further equipped with a flat spring 13, such as a leaf spiral that is configured to fit into the spring groove 8 of the respective bore hole 7. The diameter of the foot 4 itself is greater than a diameter of each of the bore holes 7. The cylindrical pin 12 is inserted into the bore holes 7 without torsion. The plurality of bore holes 7 in the base plate 1 serves to provide a plurality of selection options, with the plurality of bore holes 7, which serve as support points 7 being situated as close as possible to the part of the body of a patient to be examined. The provision of such selection options is important in order to place the two multi-element surface receiving coils, identified in FIG. 1 as left 14 and right 16 multi-element surface receiving coils, each with its respective housing 17, 18, an adjustable distance from the part of the body of a patient to be examined. It will be understood that the terms left and right are not intended to be construed as limiting the configuration of the subject device. Instead, they are applied to the device depicted in FIGS. 1 and 2 as a matter of convenience.

The left housing 17 is attached, in a positive connection, to a left, angled arm 19, preferably at a distal end 24 of that left angled arm 19, via a left joint 21. The left joint 21 can be a joint having two degrees of freedom or possibly having three degrees of freedom. For example, the left joint 21 can be a securable universal joint or a securable ball joint.

The left joint 21 makes it possible to move the left housing 17, and thereby also the, for example, first phased 4-element coil array of an RF 8-channel surface coil, which is arranged inside that left housing, as close as possible to the contour of a first side of the part of a body of a patient to be examined.

The left arm 19 is configured, for example, as a single-arm elbow lever with a first leg 22 and a second leg 23 that is connected to the first, for example, in an adhesive fashion. An angle which can be formed by the two legs 22 and 23, can range from acute to obtuse, for example up to 120°.

The distal end 24 of the left arm 19 coincides with a beginning 26 of the first leg 22. A proximal end or beginning 27 of the left arm 19 coincides with a beginning 28 of the second leg 23. The proximal end or beginning 27 of the left arm 19 has a bearing bore and is configured over a short horizontal distance, of for example 25 mm, as a tongue having a reduced cross-section and a bearing bore. At a distance "a" of, for example, 60 mm from the center of the bearing bore in the tongue formed at the proximal end 27 of the left arm 19, a left fixed member 29, which has a left-hand threaded bore hole, is attached, for example in an adhesive connection, to an outer surface 68 of the second leg 23. It will be understood that the term adhesive connotes any conventional secure attachment of the attached or connected members.

The parts 24, 26, 22, 19, 23, 27, as discussed above form an individual left support element for the left housing 17.

The right housing 18 is attached in an adhesive or secure connection to a right angled arm 31, preferably at its distal end, via a right joint 32. The right joint 32 can be a joint having two degrees of freedom or three degrees of freedom. For example, it can be a securable universal joint or a securable ball joint. The right joint 32 makes it possible for the right housing 18, and thereby also for the, for example, second phased 4-element coil array of the RF channel surface coil, which is arranged inside the right housing 18, to be moved as close as possible to the contour of the other side of the part of the body of a patient to be examined.

The right arm 31 is configured, for example, as a single-arm elbow lever with a first right leg 34 and with a second right leg 36 that is connected to the first right leg 34, for example, in an adhesive fashion. The angle which is formed by the first and second right legs 34 and 36 can range from acute to obtuse, for example up to 120°.

The distal end of the right arm 31 coincides with a beginning 37 of the first right leg 34. A proximal end or beginning 38 of the right arm 31 coincides with a beginning 39 of the second right leg 36. The proximal end or beginning 38 of the right arm 31 has two spaced, horizontal fixed members, each equipped with a bearing bore, and over a short horizontal distance, for example 25 mm. At a distance "a" of, for example, 60 mm from the center of the bearing bore, a right fixed member 40, which has a right-hand threaded bore hole, is connected in an adhesive fashion to an outer surface 41 of the second, right leg 36. The parts 37, 34, 31, 36, 38, 39 form a right individual support element for the right housing 18.

The proximal end or beginning 27 of the left arm 19 and the proximal end or beginning 38 of the right arm 31 are pivotably mounted via their bearing bores in, for example, a pivoted joint with a degree of freedom f=1 such as, for example, by being mounted on or supported by a cotter pin 42, which cotter pin 42 forms a pivoting center of a knuckle joint 43 having a degree of freedom f=1.

In the preferred embodiment, the beginning or proximal end 27 of the left arm 19 rests in, or is positioned, the form of a tongue, between the two horizontal, fixed and spaced members of the beginning or proximal end 38 of the right arm 31, which two horizontal, fixed members are spaced from one another and all of which are each equipped with a bearing bore. All three of the aligned bearing bores are threaded together onto the cotter pin or pins 42 of the knuckle joint 43.

To generate a preferably synchronous pivoting motion around the pivoting center or cotter pin or pins 42 of the joint 43, a manual actuator or motor-driven actuator 44 is provided as is shown in FIG. 1.

In its simplest form, the actuator 44 is comprised of a threaded spindle that is mounted so as to be actuatable in the interior of the knuckle joint 43 and is secured. The actuator 44, in the form of a threaded spindle, has a left threaded piece and a right threaded piece. A drive, which is not specifically shown, may be actuated, for example, at the outer end of the left threaded piece.

The exterior left hand threading of the left threaded piece of the threaded spindle of the actuator 44 is engaged with interior left handed threading which is located in a bore of a ball in a left ball joint. The ball joint is fastened, for example, at the end of a left sliding frame, which can be moved in a guide that is oriented lengthwise in the left fixed member 29. When the threaded spindle of the actuator 44 is rotated, a pivoting movement of the left arm 19 is generated via the left fixed member 29.

The right handed exterior threading of the right threaded piece of the threaded spindle is engaged with interior right handed threading which is located in a bore of a ball in a right ball joint. The ball joint is fastened, for example, at the end of a right sliding frame, which can be moved in a longitudinally oriented guide in the right fixed member 40. When the threaded spindle of the actuator 44 is rotated, a pivoting movement of the right arm 31 is effected via the right fixed member 40.

To adjust a thickness setting between the left and right multi-element surface receiving coils 14 and 16, to the part of the body to be examined, the distance of the first phased 4-element coil array of an RF 8-channel surface coil, with respect to the second phased 4-element coil array of an RF 8-channel surface coil, must be adjusted accordingly. This is accomplished, for example, through a rotation of the threaded spindle of the actuator 44. Depending upon the direction of rotation of the threaded spindle, the left angled arm 19 and the right angled arm 31 are moved toward or away from one another synchronously, around their shared rotational axis as defined by the cotter pin or pins 42. The left housing 17 and the right housing 18, with their respective first and second phased 4-element coil arrays of an RF 8-channel surface coil, follow the respective left and right angled arms 19, 31 to which they are attached. A parallel arrangement is thus approximately maintained. Fine adjustment is achieved by adjusting the left and right housings 17 and 18, respectively.

In other words, the receiving coil support elements, the left and right angled arms 19; 31, respectively, for an MR imaging system, are configured for operating two phased multi-element coil arrays of an RF multi-channel surface receiving coil 14; 16, respectively. Each of the two phased multi-element coil arrays has a receiving surface with a center through which a longitudinal axis k1, k2 passes, as may be seen in FIG. 2. Each of the multi-element coil arrays 14; 16, respectively is arranged on a movable arm 19, 31 or on an individual support element, such as, for example, on a pivotable left or right arm 19, 31, respectively that is capable of pivoting on a shared pivoting axis, generally at pivot pin 42. From the above-described, preferred arrangement, it follows that a vertical left plane that extends along the longitudinal axis K1 of the center of the left receiving surface of the left multi-element coil array 14, and a vertical right plane that extends along the longitudinal axis K2 of the center of the right receiving surface of the right multi-element coil array 16 are parallel to, and are spaced from a vertical, first plane that extends along the first pivoting axis 42 or a spaced second pivoting axis 46. From this, it follows that, based upon the shared adjusted operational setting of the multi-element coil array 14, the left plane and the right plane always each have an equal or nearly equal distance "b" from the first plane. The distance "b" of the left plane from the first plane and the distance "b" of the right plane from the first plane are adjustable. However, both distances are always equal or nearly equal to one another, when a shared, or otherwise synchronous movement of the left individual support element 24. 26, 22, 19, 23, 27 and of the right individual support element 37, 34, 31, 36, 38, 39 with their respective housings 17, 14 or 18, 16 is accomplished, typically by utilization of the actuator 44, provided as an oppositely handed, threaded spindle.

In some cases, a separate movement of each of the individual support elements is desirable. This is also within the scope and object of this invention.

The first knuckle joint 43, as seen in FIG. 1, is secured on a pin 46 of a second knuckle joint 47 with a degree of freedom f=1, and is mounted so as to be rotatable and securable in every rotational position. Between a left fixed member 48 and a right fixed member 49 of the second knuckle joint 47, a first end 52 of a rod 53 is mounted on a pin 51 so as to be capable of pivoting and of being secured on its rotational axis. The rotational axis of the pin 51 is always oriented crosswise or at 90° to the main magnetic field direction MH, which direction MH is depicted by the arrow in FIG. 2.

At the top of the foot 4, a further, third knuckle joint 54 is provided, without torsion and with a degree of freedom f=1. Between the left fixed member 56 and the right fixed member 57 of the third knuckle joint 54, a second end of the rod 53 is pivotably and securably mounted on a pin 66 on its rotational axis. The rotational axis of the pin 66 is always oriented crosswise, or at 90° to the main magnetic field direction MH which again is depicted by the arrow in FIG. 2.

With the arrangement of the second and third knuckle joints 47 and 54, respectively, it is possible to displace the entire combined receiving coil support element 6 in, and opposite to the main magnetic field direction MH, without allowing any movement crosswise with respect to the main magnetic field direction MH.

In place of the rod 53 with the two second and third knuckle joints 47 and 54, respectively, for accomplishing the longitudinal movement of the combined receiving coil support element 6 or of the individual support elements 24, 26, 22, 19, 23, 27 or 37, 34, 31, 36, 38, 39 on the base plate 1, other technical configurations can be used, such as, for example, flexible arms, which are flexible in one direction, which are free from torsion, and which can be secured in any bending position.

A change in the position of the combined receiving coil support element 6 or in the positions of the individual support elements along the upper surface 2 of the base plate 1, if desired, can be accomplished not only using the plurality of spaced bore holes 7 that are adapted to the size of the cylindrical pin 12 of the foot lower section 11. This manner of changing the position of the combined receiving coil support element 6 or the respective individual support elements 24, 26, 22, 19, 23, 27 or 37, 34, 31, 36, 38, 39 is merely a simple preferred embodiment with, for example, the use of a guide. For instance, sliding, straight guides, that are open to the upper surface 2 of the base plate 1, and which are arranged in the base plate 1, and that are parallel to, or are crosswise to the main magnetic field direction MH, such sliding, straight guides being configured as, for example, dovetailed guide grooves, could also be provided in or on the base plate 1. In such guide grooves, which are not specifically depicted and which form a stationary part of the guide a sliding block, also not depicted and which would form the movable part of the guide, and which would be adapted to the size of the dovetailed profile, could be provided, to which sliding block the foot 4 for support elements 6 or 24, 26, 22, 19, 23, 27 or 37, 34, 31, 36, 38, 39 could then be fastened. The sliding block would be easily displaceable and securable. In other words, as a result of an even movement of the sliding block, the combined receiving coil support element 6 could.

The sliding block or blocks could optionally be moved and/or secured, for example by the use of suitable MR-compatible gearsets and motors, such as hydraulic motors, servo cylinders, and the like.

The combined support element 6 can also be secured in positions other than on the base plate 1. For example, such a support element 6 could be secured directly or indirectly on the MR device with which it is intended to be used.

A receiving coil support element 6 for phased multi-element coil arrays of an RF multi-channel surface receiving coil 14; 16, each enclosed in a housing 17; 18, respectively, and, intended to enable a parallel imaging process for an MR imaging system of an MR tomograph having an operational main magnetic field direction (MH) that is determined by its main magnet, is provided. Each of the phased multi-element coil arrays 14; 16 has a receiving surface with a center having a longitudinal axis k1, k2 that passes through it. The housings 18, 17, each with its one of the phased multi-element coil arrays 14; 16 can be fastened, by the use of a respective joint 21 or 32 on the respective distal ends 24 or 37 of the individual support elements 24, 26, 22, 19, 23, 27 or 37, 34, 31, 36, 38, 39, with one support element being provided for each housing 17 or 18.

The respective beginnings 28 or 39 of the individual support elements 24, 26, 22, 19, 23, 27 or 37, 34, 31, 36, 38, 39 can be connected in a positive or adhesive fashion. A base plate 1 that can be introduced into the interior of an MR tomograph is provided. The base plate 1 has a number of mounting devices 7 for the individual support elements 24, 26, 22, 19, 23, 27 or 37, 34, 31, 36, 38, 39.

Figure 2:
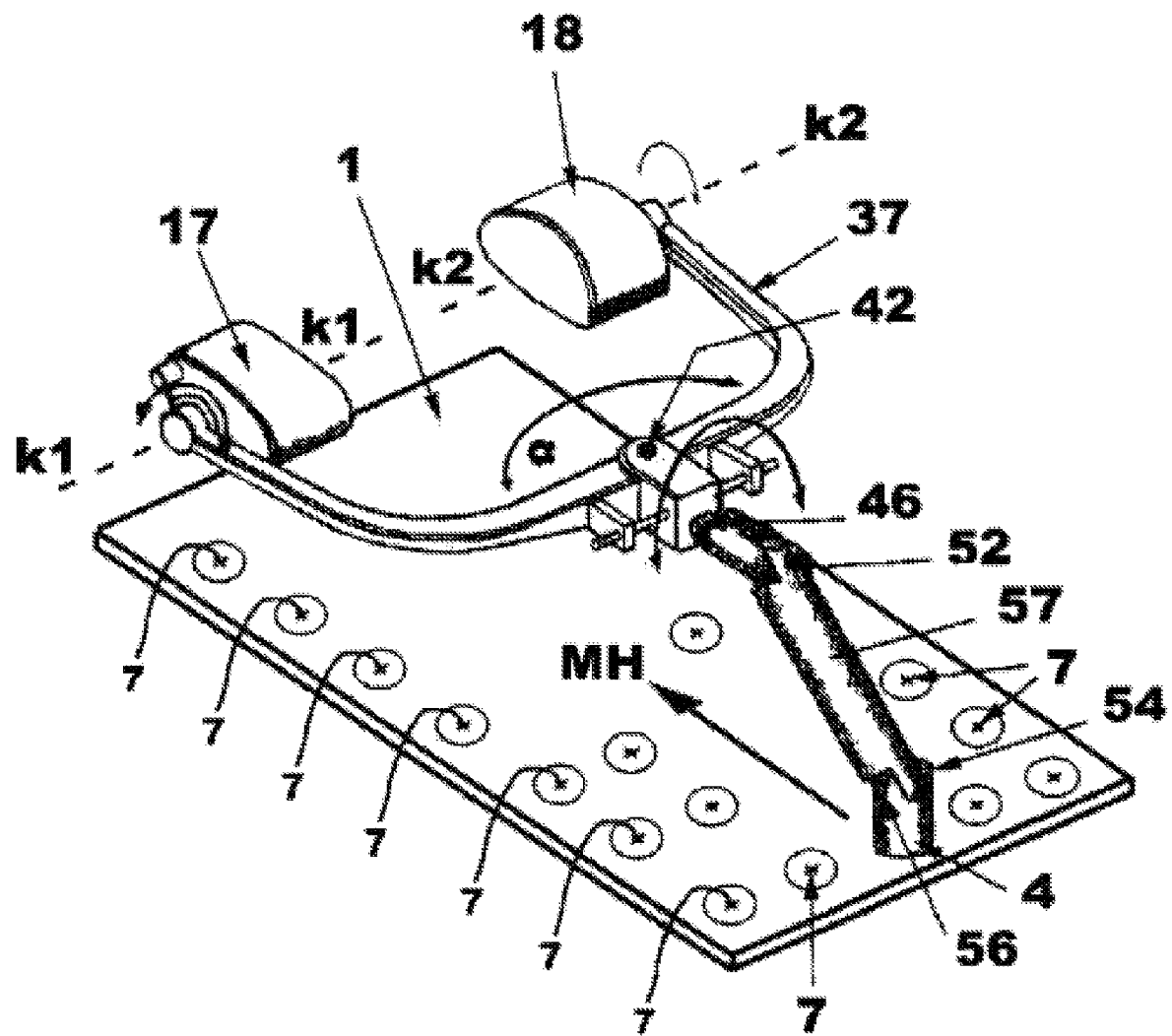

As mounting devices 7, a number of straight guides and/or sliding key connections can be provided in an embodiment which is not specifically shown in FIGS. 1 and 2.

On the base plate 1, the stationary part of the guide and/or of the sliding key connection is attached. The stationary part of the straight guides and/or the sliding key connection is oriented in, and/or is crosswise or laterally parallel to the provided operational main magnetic field direction (MH) of the main magnetic field of the provided MR tomograph. The beginnings 28, 39 of the two individual support elements 24, 26, 22, 19, 23, 27; 37, 34, 31, 36, 38, 39 can be connected directly or indirectly, each to one of, or to a single shared, movable part of the straight guide, such as, for example, to movable sliding blocks or to sliding key connections that are adapted to the size of the profile of the stationary guide. In other words, the movable parts of the guide and the sliding key connection and the stationary part of the guide are connected in a positive fashion to form a sliding fit.

In a further embodiment of the present invention, at least one of the two individual support elements 24, 26, 22, 19, 23, 27; 37, 34, 31, 36, 38, 39 is mounted, either directly or indirectly, on a movable part 43 of a two component bearing 43, 46. The movable part 43 of the two component bearing 43, 46 is rotatably mounted on a supporting part 46 of the bearing 43, 46. In this embodiment, a longitudinal axis of the supporting part 46 is forced into an orientation in, and opposite to the provided operational main magnetic field direction MH or in a horizontal direction, parallel to the former. The supporting part 46 may be supported either directly or indirectly on the base plate 1. Its vertical distance from the base plate 1 is also adjustable. Distances of the housings 18, 17 from one another, as viewed crosswise to the provided operational main magnetic field direction MH, is also variable, for example by displacing the sliding blocks or feet with the individual support elements that are connected to them, in a positive or adhesive fashion.

The position of each housing 18, 17 with its multi-element coil array 14; 16, when viewed in, and opposite to the provided operational main magnetic field direction MH, is adjustable. To this end, the individual support elements 24, 26, 22, 19, 23, 27; and 37, 34, 31, 36, 38, 39 can have corresponding longitudinally oriented straight guides, on the movable and securable parts of which straight guides, the housings 18, 17 are fastened via the joints 32, 21.

The joints 21; 32 are pivotable and are securable and each have a degree of freedom f=2 or f=3. The beginnings 28, 39 of the two individual support elements 24, 26, 22, 19, 23, 27; or 37, 34, 31, 36, 38, 39 are connected, for example, via a joint 42, or 43. In this manner, an opening angle=α between the two individual support elements 24, 26, 22, 19, 23, 27; and 37, 34, 31, 36, 38, 39, as depicted in FIG. 2 can be adjusted to any desired size.

While preferred embodiments of a receiving coil support element for an MR imaging system, in accordance with the present invention, have been set forth fully and completely hereinabove, it will be apparent to one of skill in the art that various changes in, for example, the specific structure of the MR surface receiving coils, the specific source of the MR signal, and the like could be made without departing from the true spirit and scope of the present invention which is accordingly to be limited only by the appended claims.

What is claimed is:

1. A receiving coil support comprising:
   a first phased multi-element coil array in a first radiofrequency multi-channel support receiving coil;
   a first housing for said first phased multi-element coil array;
   a second phased multi-element coil array in a second radiofrequency multi-channel support receiving coil;
   a second housing for said second phased multi-element coil array, said first and second coil arrays being adapted to enable a parallel imaging process for an magnetic resonance imaging system of an magnetic resonance tomograph and with an operational main magnetic field direction;
   a first receiving surface for said first phased multi-element coil array and having a first center through which a first longitudinal axis passes;
   a second receiving surface for said second phased multi-element coil array and having a second center through which a second longitudinal axis passes;
   a receiving coil support holder including having a first arm free end and a second arm having a second arm free end;
   a first pivot joint securing said first housing to said free end of said first arm of said receiving coil support holder; and
   a second pivot joint securing said second housing to said free end of said second arm of said receiving coil support holder.

2. The receiving coil support of claim 1 wherein each of said first and second arms of said receiving coil support element is a leaf spring.

3. The receiving coil support of claim 2 wherein each of said leaf springs is flexible to bending.

4. The receiving coil support of claim 1 wherein said first arm and said second arm each has an arm beginning which first arm beginning is remote from each said first arm pivot joint connection to said first housing, and which second arm beginning is remote from said second arm pivot joint connection to said second housing, said first arm beginning and said second arm beginning being positively connected to each other.

5. The receiving coil support of claim 4 wherein said positive connection is a pivot point.

6. The receiving coil support of claim 1 wherein said first housing and said second housing are positioned with said first receiving surface and said second receiving surface being opposite to each other.

7. The receiving coil support of claim 1 further including a base plate adapted to be positioned in the interior of an magnetic resonance tomograph, said base plate including mounting means for said receiving coil support element.

8. The receiving coil support of claim 7 wherein said mounting means include at least one of straight guides and sliding key connections.

9. The receiving coil support of claim 8 further including a stationary part of said at least one of said straight guide and said sliding leg connection on said base plate.

10. The receiving coil support of claim 9 wherein said stationary part of said at least one of said straight guide and said sliding leg connection is oriented one of transverse to and parallel to said operational main magnetic field directions and further wherein said first and second arms are connected to one of said straight guide and said sliding key connection, said straight guide and said sliding key connection being positively connected and forming a sliding fit.

11. The receiving coil support of claim 1 further including a bearing including a movable bearing part and a supporting bearing part, each of said first and second arms being connected to said movable bearing part, said movable bearing part having a longitudinal axis oriented in said operational main magnetic field direction, and further including a base plate, said supporting bearing part being supported on said base plate and having an adjustable distance with respect to said base plate.

12. The receiving coil support of claim 1 wherein a distance between said first housing and said second housing in a direction transverse to said operational main magnetic field direction is adjustable.

13. The receiving coil support of claim 1 wherein a position of each of said first and second housings, in said operational main magnetic field direction, is adjustable.

14. The receiving coil support of claim 1 wherein said first joint and said second joint each have at least two degrees of freedom.

* * * * *